United States Patent [19]
Ong

[11] 3,968,437
[45] July 6, 1976

[54] RECEIVER INCLUDING AN AUTOMATIC TUNING CORRECTION SUPPRESSION CIRCUIT COUPLED TO A TUNING MEMBER

[75] Inventor: Kian Kie Ong, Eindhoven, Netherlands

[73] Assignee: U.S. Philips Corporation, New York, N.Y.

[22] Filed: May 21, 1975

[21] Appl. No.: 579,307

Related U.S. Application Data
[63] Continuation of Ser. No. 413,814, Nov. 8, 1973, abandoned.

[30] Foreign Application Priority Data
Nov. 15, 1972 Netherlands............. 7215429

[52] U.S. Cl............. 325/422; 178/5.8 AF; 325/456; 325/469; 334/16
[51] Int. Cl.²............................. H04B 1/16
[58] Field of Search............. 178/5.8 AF; 325/416–423, 346, 457, 456, 469, 470; 331/14, 16, 30; 334/14–16

[56] References Cited
UNITED STATES PATENTS

| | | | |
|---|---|---|---|
| 3,806,817 | 4/1974 | Uchida | 334/16 |
| 3,889,193 | 6/1975 | Sasaki et al. | 325/419 |

Primary Examiner—Robert L. Griffin
Assistant Examiner—Marc E. Bookbinder
Attorney, Agent, or Firm—Frank R. Trifari; Henry I. Steckler

[57] ABSTRACT

Switching off the automatic tuning correction of a receiver during tuning is accomplished with a signal derived from a level variation caused by a level adjusting circuit coupled to a tuning member.

5 Claims, 2 Drawing Figures

RECEIVER INCLUDING AN AUTOMATIC TUNING CORRECTION SUPPRESSION CIRCUIT COUPLED TO A TUNING MEMBER

This is a continuation, of application Ser. No. 413,814, filed Nov. 8, 1973, now abandoned.

The invention relates to a receiver including an automatic tuning correction suppression circuit coupled to a tuning member for rendering the automatic tuning correction inactive during operation of the tuning member.

A receiver of the kind described above is known from U.S. Pat. No. 3,308,382 in which the tuning member is coupled to a switch for switching off the automatic tuning correction. In such a receiver the automatic tuning correction may tune the receiver to a transmitter of an unwanted frequency during switching on when the tuning member is generally not operated.

An object of the invention is to obviate this drawback.

To this end a receiver of the kind described in the preamble according to the invention is characterized in that a level variation detector is coupled to a level adjusting circuit coupled to the tuning member, while an output of said detector is coupled to an operation signal input of the tuning correction suppression circuit.

By using a level adjusting circuit whose supply voltage automatically changes by switching on the receiver a level variation occurs at the input of the level variation detector when the receiver is switched on and tuning to an unwanted frequency is avoided.

The prior art receivers furthermore often include a level adjusting circuit in the form of a tuning voltage adjusting circuit so that this circuit may be used for an automatic correction suppression circuit according to the invention.

The invention will be described in greater detail with reference to the drawing.

Figure 1:
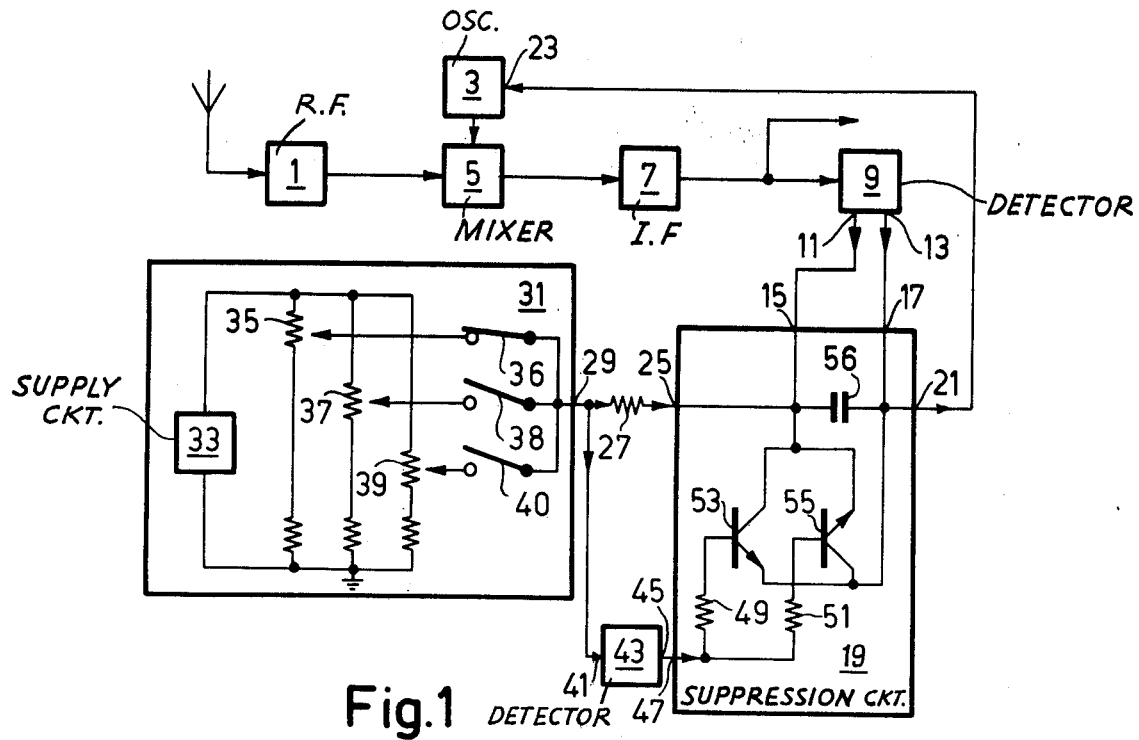
FIG. 1 shows by way of a block schematic diagram a receiver according to the invention.

In FIG. 1 the receiver has an RF section 1, a mixer circuit 5 coupled to this section and to an oscillator 3, an IF amplifier 7 coupled to an output of the mixer circuit 5 and a tuning deviation detection circuit 9 coupled to an output thereof such as, for example, a frequency or phase deviation detection circuit.

The receiver may be either a radio or a television receiver whose further signal-processing sections are not important for the understanding of the invention and which have therefore been omitted for the sake of clarity.

The tuning deviation detection circuit 9 has an output 11, 13 which is connected to an input 15, 17 of a tuning correction suppression circuit 19. An output 21 of the latter circuit is connected to a tuning signal input 23 of the oscillator 3 and an input 25 is connected through a resistor 27 to an output 29 of a level adjusting circuit 31.

The level adjusting circuit 31 has a supply circuit 33 which provides a voltage for a plurality of potentiometers 35, 37 and 39 which voltage can be applied as an adjustable voltage to the output 29 through the wipers on these potentiometers and a plurality of switches 36, 38 and 40. The potentiometers 35, 37 and 39 may be, for example, of a preset type so that the actual tuning member is only constituted by the switches 36, 38 and 40. It is, however, alternatively possible that, for example, at least one of these potentiometers is connected to a graduated scale and is provided with a tuning knob.

When operating a tuning member for varying the tuning of the receiver a voltage variation will occur at the output 29 of the level adjusting circuit 31. This voltage variation is detected by a further level variation detector 43 having an input 41 connected to this output 29 and is converted into a signal which indicates that a variation occurs and which becomes available at an output 45. This signal is applied to an operation signal input 47 of the tuning correction suppression circuit 19 and reaches via two resistors 49, 51 the bases of two antiparallel arranged npn transistors 53, 55 which become conducting as a result of this signal and short-circuit the input 15, 17 so that the input 25 is directly connected to the output 21 of the tuning correction suppression circuit. The oscillator tuning is then effected without being influenced by the automatic tuning correction. A comparable situation occurs when the receiver is switched on and the voltage supplied by the supply 33 varies. The automatic tuning correction can then only be pulled in when the supply voltage has become constant. When the voltage at the output 29 of the level adjusting circuit 31 no longer changes, the switch-off signal at the output 45 of the level variation detector 43 disappears and the transistors 53, 55 are cut off. The voltage applied to the inputs 15, 17 and added to the voltage applied to the input 25 then appears between the input 25 and the output 21 of the tuning correction suppression circuit 19. In addition to the tuning voltage for the desired transmitter a tuning correction voltage originating from the tuning deviation detection circuit 9 is applied to the input 23 of the oscillator 3 so that an automatic frequency control of the oscillator 3 to the desired transmitter is effected.

When short-circuiting the output 11, 13 of the tuning deviation detection circuit 9 a smoothing capacitor 56 of this detection circuit which is shown in the Figure in the tuning correction suppression circuit 19 is discharged so that no unwanted detuning can occur when the automatic tuning correction is switched on again. This is a very attractive property especially in receivers employing stepwise tuning such as, for example, remote control receivers.

It will be evident that when using variable capacitors or inductors for tuning the oscillator 3, the ouput 29 of the level adjusting circuit 31 is not connected to the input 25 of the tuning correction suppression circuit which is then connected to a fixed potential. The level adjusting circuit 31 may then comprise a potentiometer having an adjustment which is mechanically coupled to the capacitance or inductance adjustment.

Figure 2:
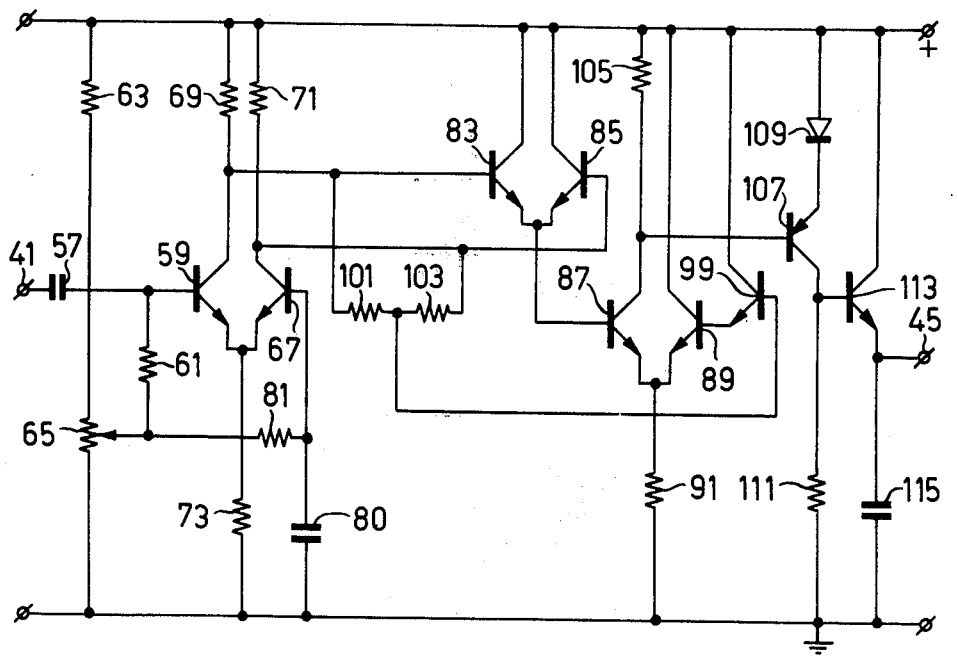
FIG. 2 shows a possible embodiment of a level variation detector for a receiver according to the invention.

In FIG. 2 in which a possible embodiment of a level variation detector 43 is shown the input 41 and the output 45 are enumerated in accordance with the enumeration in FIG. 1.

The input 41 is connected through a capacitor 57 to the base of an npn transistor 59 which is furthermore connected via a resistor 61 to the tap on an adjustable potential divider 63, 65. Together with these resistors the capacitor 57 constitutes a differentiating network which applies a voltage to the base of the transistor 59 only when a voltage variation occurs at the input 41.

The transistor 59 is coupled through its emitter to an npn transistor 67 and these transistors constitute a phase inverter amplifier having two outputs in phase opposition which are constituted by the collectors of these transistors which are fed through two resistors 69, 71. The emitters of the two transistors 59, 67 are connected to earth through a resistor 73. The base of the transistor 67 is connected to earth through a capacitor 80 and is connected via a resistor 81 to the same bias as that of the transistor 67.

The collectors of the transistor 59, 67 are connected to the bases of two npn transistors 83 and 85, respectively, whose emitters are interconnected and whose collectors are connected to the supply voltage. These transistors 83, 85 thus constitute a rectifier circuit which converts voltage variations of different polarities at the input 41 into corresponding signals having the same polarity at their common emitters.

The emitters of the transistors 83, 85 are connected to the base of a npn transistor 87 which constitutes a comparison circuit together with another npn transistor 89. Their emitters are interconnected and are connected to earth through a resistor 91. The base of the transistor 89 is connected through an emitter follower 99 to an averaging circuit which in this case is a potential divider including two resistors 101, 103 between the collectors of the transistors 59, 67 of the phase inverter amplifier. The collector of the transistor 87 is connected through a resistor 105 and that of the transistor 89 is directly connected to the supply voltage.

The base of a pnp transistor 107 is connected to the collector of the transistor 87 and its emitter is connected through a diode 109 to the supply voltage and its collector is connected to earth through a resistor 111. Together with the diode 109 this transistor 107 constitutes a threshold circuit. Its collector is furthermore connected to the base of an npn transistor arranged as an emitter follower whose emitter is connected to the output 45 with a storage capacitor 115.

The operation of the circuit arrangement is as follows.

Voltage variations at the input 41 produce signals of opposite polarity at the collectors of the transistors 59, 67 which signals do not, however, influence the level at the tap on the potential divider 101, 103 of the averaging circuit. Due to the rectifier circuit 83, 85 a positive going signal is produced at the comparison circuit 87, 89 both when the voltage at the input 41 increases and when it decreases. This positive signal results in a negative going signal at the base of the transistor 107. The transistor 107 is normally cut off and only becomes conducting when the voltage across the resistor 105 becomes sufficiently large. The rest condition of this voltage is ensured by the potentiometer 65 which determines the voltage across the resistor 105 through the transistors 59, 67; 83, 85 and 87, 89.

A sufficiently large negative going signal at the base of the transistor 107 causes its collector voltage to increase from earth potential to the supply voltage reduced by the voltage across the diode 109. The voltage across the capacitor 115 then changes from zero to substantially the supply voltage when a voltage variation occurs at the input 41.

Together with the circuit connected to the output 45, the capacitor 115 constitutes a time constant which is sufficiently long, for example, several and preferably two seconds to insure that the automatic tuning correction still remains inactive right after the occurrence of a voltage variation at the input 41 so as to prevent this correction from becoming active unexpectedly in case of an uneven operation of the tuning member in a receiver having a continuously adjustable tuning.

It will be evident that the tuning correction suppression circuit according to the invention may alternatively be used for digital tuning circuits.

In receivers using an automatic station finder in which the tuning voltage varies until a station is found the automatic tuning correction is switched off by the circuit arrangement according to the invention until the desired station is found whereafter the tuning voltage no longer varies and the automatic tuning correction is rendered active again. When the automatic station finder uses an output signal from the tuning deviation detection circuit for the purpose of discontinuing a finding action, this detection circuit must have a further output which is not influenced by the tuning correction suppression circuit and which can continue to supply the desired output signal when the tuning correction is switched off.

Furthermore it will be evident that, if desired, a current variation detection instead of a voltage variation detection may be effected when the level adjusting circuit produces a bias current instead of a bias voltage as in the embodiment described.

Of course the output signal from the tuning deviation detection circuit may alternatively be suppressed in other manners by means of the level variation detection circuit such as, for example, by suppressing an input signal from the tuning deviation detection circuit.

The tuning correction suppression circuit according to the invention is also suitable for receivers having a combination of a tuning voltage or tuning current with an automatic tuning correction voltage or current other than the described series arrangement.

What is claimed is:

1. Tuning means for an oscillator tuning member, said tuning means comprising automatic tuning correction means, automatic tuning correction suppression means for coupling to said tuning member and said automatic tuning correction means, said suppression means having a suppression activation input terminal, a tuning signal level adjusting circuit, means for applying a voltage to said adjusting circuit, tuning signal level variation detector including a differentiator coupled to said adjusting circuit and said suppression activation input to render said automatic tuning correction means inactive when said adjusting circuit output is varied.

2. A tuning means as claimed in claim 1 in which the level variation detector includes a phase inverter circuit coupled to said differentiator and having outputs for signals in phase opposition which outputs are coupled at least though a rectifier circuit to the tuning correction suppression circuit.

3. A tuning means as claimed in claim 2, wherein an output of the rectifier circuit is coupled to a comparison circuit first input, and further comprising an averaging circuit having inputs coupled to the outputs of the phase inverter circuit and an output coupled to the comparison circuit second input.

4. A tuning means as claimed in claim 3, further comprising a threshold circuit, an output of the comparison circuit being coupled to said threshold circuit.

5. A tuning means as claimed in claim 1, wherein the output of the level variation detector means includes a capacitor means for providing a time constant of several seconds.

* * * * *